United States Patent
Xu et al.

(10) Patent No.: US 8,154,270 B2
(45) Date of Patent: Apr. 10, 2012

(54) POWER-UP CONTROL FOR VERY LOW-POWER SYSTEMS

(75) Inventors: Jane Xu, South Setauket, NY (US); Steven Burstein, Smithtown, NY (US); Jay D. Popper, Jamaica, NY (US)

(73) Assignee: Standard Microsystems Corporation, Hauppauge, NY (US)

( * ) Notice: Subject to any disclaimer, the term of this patent is extended or adjusted under 35 U.S.C. 154(b) by 485 days.

(21) Appl. No.: 12/371,375

(22) Filed: Feb. 13, 2009

(65) Prior Publication Data

US 2010/0207596 A1      Aug. 19, 2010

(51) Int. Cl.
G05F 5/00    (2006.01)

(52) U.S. Cl. .......................................... 323/303

(58) Field of Classification Search ................... 323/303; 361/91.1; 363/50
See application file for complete search history.

(56) References Cited

U.S. PATENT DOCUMENTS

| | | | |
|---|---|---|---|
| 5,471,175 A * | 11/1995 | Chiu et al. ..................... | 330/298 |
| 5,684,415 A | 11/1997 | McManus | |
| 6,141,200 A | 10/2000 | Hinedi et al. | |
| 6,377,075 B1 | 4/2002 | Wong | |
| 6,633,470 B2 | 10/2003 | Ponton et al. | |
| 6,690,555 B1 | 2/2004 | Pasqualini | |
| 6,700,431 B1 | 3/2004 | Fotouhi et al. | |
| 6,775,121 B1 | 8/2004 | Chaudhry | |
| 6,798,244 B1 | 9/2004 | Sharpe-Geisler | |
| 6,898,060 B2 | 5/2005 | Juliano et al. | |
| 6,922,322 B2 | 7/2005 | Strayer et al. | |
| 6,940,703 B1 | 9/2005 | Kemp et al. | |
| 7,085,117 B2 | 8/2006 | Bullock et al. | |
| 7,233,466 B2 * | 6/2007 | Yamaguchi ..................... | 361/56 |
| 7,649,726 B2 | 1/2010 | Castro | |
| 7,746,612 B2 | 6/2010 | Xu et al. | |
| 7,768,752 B2 | 8/2010 | Souma | |
| 7,813,093 B2 | 10/2010 | Boyko et al. | |
| 2009/0152950 A1 | 6/2009 | Zhang et al. | |
| 2009/0195943 A1 | 8/2009 | Liu et al. | |
| 2009/0206887 A1 | 8/2009 | Boyko et al. | |
| 2009/0207544 A1 | 8/2009 | Boyko et al. | |

* cited by examiner

*Primary Examiner* — Adolf Berhane
*Assistant Examiner* — Yemane Mehari
(74) *Attorney, Agent, or Firm* — Meyertons Hood Kivlin Kowert & Goetzel, P.C.; Jeffrey C. Hood

(57) ABSTRACT

An input protection circuit (IPC) may prevent an input signal from propagating into a system, such as an integrated circuit (IC), when the voltage level of the input signal exceeds a specified value. The IPC may be configured to compare the input signal voltage, which may be that of an external input signal received by the system, with a reference voltage, which may be the power supply voltage. If the input signal voltage exceeds the reference voltage, the output of the IPC may be set to the value of a specified clamp voltage. If the input signal voltage does not exceed the reference voltage, the output of the IPC may track (or follow) the input signal voltage. For certain integrated circuits, the IPC may be configured to provide circuit protection for an input signal voltage ranging between 0V to 5V, and a power supply voltage ranging between 3.0V and 3.6V.

25 Claims, 4 Drawing Sheets

POWER-UP CONTROL FOR VERY LOW-POWER SYSTEMS

BACKGROUND OF THE INVENTION

1. Field of the Invention

This invention relates generally to the field of semiconductor circuit design, and more particularly to the design of improved over-voltage protection in low-power systems.

2. Description of the Related Art

In contemporary electric circuit design, systems oftentimes require large number of devices to be configured on as small an area as possible in order to save cost and increase the system's operating speed. This trend has affected the design of integrated circuits (IC), including microprocessors, microcontrollers, and even Systems-On-Chip (SOC), in which all components of a computer or other electronic system are integrated on a single IC. SOCs may contain digital, analog, mixed-signal, and often radio-frequency components all configured on a single IC. In decreasing the area of an IC on which the system or microprocessor is integrated, the geometry shrink is three dimensional, including a reduction in the thickness of the gate oxide layer. As a consequence, the level of the power supply voltage provided to the IC needs to be lowered in order to accommodate the thinner gate oxide. However, many peripheral devices connected to the IC (e.g. to a processor) may still require higher supply voltages, resulting in higher signaling levels for those devices. Since these devices are connected to the IC, the IC may be exposed to input signals having a voltage level that exceeds the level of the supply voltage powering the IC, potentially resulting in circuit malfunction and/or destruction of the IC. This makes it necessary to implement some form of protection into the integrated circuit, to preempt damage caused by high-voltage input signals.

Some IC designs have strict input requirements, which prohibit the voltage level of input signals from exceeding the internal power supply voltage, or external supply voltage that is powering the IC. However, when the input signal is signal external to the IC (chip) and provided to an on-chip pin, this requirement cannot always be satisfied. For example, it is possible for the actual voltage at the pin to rise to a higher voltage, e.g. 5V, when the drivers of devices external to the chip are coupled to on-chip pins. Various mechanisms and solutions have been devised to protect the IC from such high voltage input signals. One approach involves configuring a circuit for an off-chip driver output stage to provide protection. Another approach includes a circuit configured to protect the transistor from gate-oxide dielectric breakdown and hot-carrier degradation. In some cases a circuit may be configured to provide high voltage protection of the transistor with a 5V power supply and a 5V output voltage of a buffer. However, there are cases when none of those solutions may be applicable due to various design constraints, while the inputs of the circuit still require protection from high voltage signals when the input pin voltage exceeds the voltage of the power supply.

Many other problems and disadvantages of the prior art will become apparent to one skilled in the art after comparing such prior art with the present invention as described herein.

SUMMARY OF THE INVENTION

In one set of embodiments, an input protection circuit (IPC) may be configured to provide high voltage circuit protection for a system, such as an integrated circuit (IC). The IPC may be configured to compare an input signal voltage, which may be from an external input signal received by the system, with the power supply voltage, which may be configured to power the system. If the input signal voltage is higher than the supply voltage, the output of the IPC may be set to the value of the supply voltage. If the input signal voltage is less than or equal to the supply voltage, the output of the IPC may be set to the same value as the value of the input signal voltage. In one set of embodiments, the IPC may be configured to provide circuit protection for an input signal voltage operating range of between 0V to 5V, and a power supply voltage operating range of between 3.0V and 3.6V.

In one embodiment, the IPC may include a comparator configured to compare the voltage level $V_{IN}$ of an input signal at the input pin of the IC with the power supply voltage $V_{DD}$. $V_{DD}$ may be internal to the IC or it may be provided externally to the IC. In general, $V_{DD}$ in this case refers to the supply voltage used to power the IC, and having a specified, allowed operating range that comprises a maximum value that is not to be exceeded in the IC. When $V_{IN} < V_{DD}$, the output $C_{OUT}$ of the comparator may be deasserted (e.g. set to 0), which may set the output $V_{OUT}$ of a multiplexer switch to the value of $V_{IN}$. When $V_{IN} \geq V_{DD}$, the output $C_{OUT}$ of the comparator may asserted (e.g. set to 1), which may set the output $V_{OUT}$ of the multiplexer switch to the value of $V_{DD}$. A level shifter circuit may be used to actually change the assertion level of the multiplexer control signal. The circuit topology of the level shifter may be configured such that a left branch of the level shifter circuit is powered by the power supply voltage $V_{DD}$, while a right branch of the level shifter circuit is powered by a slightly attenuated version of the input voltage $V_{IN}$, for example, a voltage obtained at one end of a resistor with the other end of the resistor receiving the input signal $V_{IN}$. The level shifter circuit may be configured to basically follow the same logic as the comparator. If $V_{IN} < V_{DD}$, the output of the comparator may be deasserted (e.g. $C_{OUT} = 0$), which in turn may deassert the output of the level shifter (e.g. $L_{OUT} = 0$). Similarly, if $V_{IN} > V_{DD}$, the output of the comparator may be asserted (e.g. $C_{OUT} = 1$), which may in turn set the output of the level shifter to follow the input voltage $V_{IN}$ (i.e. $L_{OUT} = V_{IN}$). The level shifter may thus be used to fully prevent the input voltage $V_{IN}$ from reaching the output of the multiplexer switch when $V_{IN} \geq V_{DD}$.

In one set of embodiments, an analog multiplexer may be configured to switch between $V_{IN}$ and $V_{DD}$. The analog multiplexer may be controlled by a comparator and a level shifter, and may comprise PMOS devices configured with a floating well to keep the well of the PMOS devices at the highest available voltage (either $V_{DD}$ or $V_{IN}$, depending on which one is higher). A resistor (150Ω in some embodiments) may be coupled in series with the input voltage $V_{IN}$ for latch up protection. The level shifter may also include a diode bias circuit to provide 1.2V at the PMOS gate for high voltage protection. The bias circuit may comprise three transistor devices. Two diode-connected NMOS devices having their channels coupled in series, the top most NMOS device coupled $V_{DD}$, which may be a 3.3V power supply. One diode-connected PMOS device may have one end of its channel coupled in series with the channel of the bottom NMOS device, with the other end of the channel of the PMOS device coupled to reference ground ($V_{SS}$). The total threshold voltage of the three diode-connected transistor devices may be greater than the power supply $V_{DD}$ due to the body effect, resulting in the bias circuit not conducting a DC current.

In one set of embodiments, an integrated circuit may include a function block, and at least one input pin configured to receive an input signal intended for at least one specific destination within the function block. The integrated circuit may also include a protection circuit coupled between the input pin and the function block. The protection circuit may be configured to allow the input signal to propagate to the specific destination within the function block when the voltage value of the input signal does not exceed the value of a specified reference voltage. In addition, the protection circuit may be configured to provide a replacement signal to propagate to the specific destination instead of the input signal, when the voltage value of the input signal exceeds the value of the specified reference voltage. The voltage value of the replacement signal may be no greater than the value of a supply voltage configured to power the integrated circuit, and it may correspond to the logic level represented by the voltage value of the input signal.

One method for protecting a system against high voltage may include receiving an input signal intended for at least one specific destination within the system and intercepting the input signal before it reaches the specific destination within the system. The input signal may be allowed to propagate to the specific destination within the system when the voltage value of the input signal does not exceed the value of a specified reference voltage, but it may be replaced with a replacement signal when the voltage value of the input signal exceeds the value of the specified reference voltage. The replacement signal may be generated with a voltage value no greater than the value of a supply voltage configured to provide power to the system, while corresponding to the logic level represented by the voltage value of the input signal. The replacement signal may then be propagated to the specific destination within the system in lieu of the input signal.

Various embodiments of a protection circuit disclosed herein satisfy the requirement of relaying an input signal, (in other words tracking the input signal) received at an input pin of the IC to the circuitry on the IC when the input signal voltage is less than or equal to a selected reference voltage, which may be the power supply voltage $V_{DD}$, and fixing the input voltage at the level of a clamp voltage (which have the same value as the reference voltage and/or $V_{DD}$) when the input signal voltage at the input pin is greater than the reference voltage. Various embodiments of the circuit may also provide protection against latch-up.

Other aspects of the present invention will become apparent with reference to the drawings and detailed description of the drawings that follow.

BRIEF DESCRIPTION OF THE DRAWINGS

The foregoing, as well as other objects, features, and advantages of this invention may be more completely understood by reference to the following detailed description when read together with the accompanying drawings in which.

Figure 1:
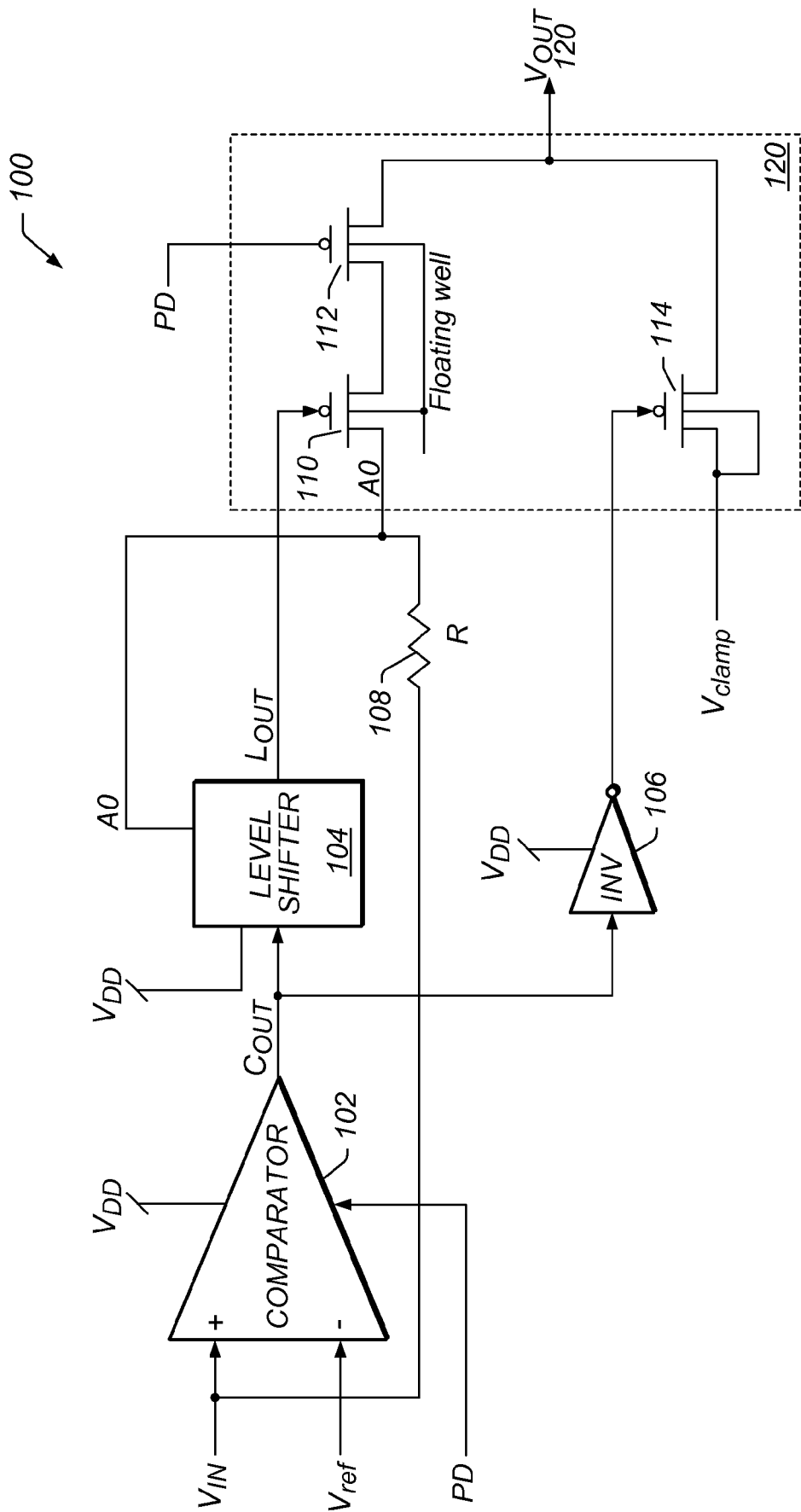
FIG. 1 shows a logic/circuit diagram of one embodiment of an input protection circuit for protecting a system against high-voltage input signals.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "connected" means "directly or indirectly connected", and the term "coupled" means "directly or indirectly connected".

DETAILED DESCRIPTION OF THE PREFERRED EMBODIMENTS

As used herein, the term "nominal value" is used to denote an expected, stable value. For example, the nominal value of a first supply voltage is used to denote the final, stable value reached by the first supply voltage. While the term "nominal" typically refers to a specified theoretical value from which an actual value may deviate ever so slightly, in order to simplify references to certain voltage values detailed herein, "nominal value" is used to refer to the final, expected stable value reached by a supply voltage. For example, as used herein, when a supply voltage has a nominal value of 3.3V, it means that the supply voltage is configured to settle and reside at a value of 3.3V. Of course, the actual value of the supply voltage may deviate ever so slightly from this value, and the term "nominal value" is meant to account for such deviations.

Also, as used herein, a first signal "tracking" or "following" a second signal, or the value of the first signal "tracking" or "following" the value of the second signal denotes that the first signal changes as the second signal changes. In other words, if the second signal rises at a first rate, the first signal also rises at the first rate. Similarly, if the second voltage changes from 1V to 2V, the first signal also changes from 1V to 2V, and so on. Thus, a first signal tracking (or following) a second signal is meant to denote that the first signal is configured to have a value that is the same as the value of the second signal, and furthermore to change in the same manner as the second signal changes.

As referenced herein, signals may be said to be "asserted" and "deasserted". In general these terms are meant to denote a logic state of a signal in a digital system. A signal may effect one stimulus within the system when it is asserted (i.e. when it has one logic state), and another stimulus when it is deasserted (i.e. it has another logic state). Typically, an "asserted" state corresponds to a logic value of 1, and a "deasserted" state corresponds to a logic value of 0. Furthermore, a different actual voltage value may be associated with each state. While in digital systems a logic state of 1 is usually associated with a high voltage ($V_{DD}$) and a logic state of 0 is usually associated with a low voltage (GND, or $V_{SS}$), in some cases the operation of a system may best be described by associating a low voltage with an "asserted" state, and a high voltage with a "deasserted" state. Those skilled in the art will appreciate that "asserted" and "deasserted" are relative terms, and that alternate embodiments may feature assertion levels different from those disclosed herein, without changing the relationship of the affected signals with respect to each other, and without altering their desired functionality within the system.

Various embodiments of circuits presented herein comprise a resistor or resistors. Those skilled in the art will appreciate that resistors may be obtained in a variety of different ways, and that the resistors disclosed herein are meant to represent circuit elements whose electrical characteristics would match the electrical characteristics of resistors as configured in the disclosed embodiments. In other words, there may be embodiments where one or more transistor devices are configured to behave in a manner commensurate with the behavior of a resistor or resistors, and the resistors disclosed herein are meant to embody all components and/or circuit elements that may be configured as resistors. Similarly, any reference to "diodes" is meant to encompass all components and/or circuit elements that may be configured as diodes. For example, a "diode-connected transistor" may be used interchangeably with a "diode".

Finally, references are made herein to "channels" of transistors. While the structure of a (Metal-Oxide Semiconductor Field Effect Transistors) MOSFET comprises an identifiable channel that is well known to those skilled in the art, bipolar devices (also referred to as bipolar junction devices or bipolar junction transistors—BJT) may oftentimes be swapped with MOSFET devices in certain circuit configurations to obtain similar or identical operating characteristics in those circuits. While the structure of a bipolar device might not comprise an identifiable "channel" exactly like a MOSFET (or FET) device, for the sake of simplicity, a conductive or operational path established between the collector and emitter of a bipolar device (or BJT) is also referenced herein as the "channel" of that device. In other words, when referencing the "channel" of a given transistor, the word "channel" may equally refer to the operational (or conductive) path established between the drain and the source of the transistor device if the device is a MOSFET (FET), or between the collector and the emitter of the transistor device if the device is a bipolar device (e.g. BJT).

In one set of embodiments, an input protection circuit (IPC) 100 may be configured to provide high voltage circuit protection for a system, such as an integrated circuit (IC). An input signal $V_{IN}$ entering the system or IC may be provided to IPC 100, and the output $V_{OUT}$ 120 of IPC 100 may then be propagated into the system as representative of (or corresponding to) the input voltage $V_{IN}$. IPC 100 may include comparator 102 configured to compare the input signal voltage $V_{IN}$, with a reference voltage signal $V_{ref}$. In certain embodiments, $V_{ref}$ may be an equivalent voltage to power supply voltage $V_{DD}$, which is configured to power the IC or system in which IPC 100 is configured. While in the embodiments disclosed herein $V_{ref}$ may take on the value of $V_{DD}$, in alternate embodiments $V_{ref}$ may be specified to any desired value to which $V_{IN}$ is to be compared. When the input signal voltage $V_{IN}$ is greater than or equal to the reference voltage $V_{ref}$, $V_{OUT}$ 120 of IPC 100 may be set to the value of the clamp voltage $V_{clamp}$, and when the input signal voltage $V_{IN}$ is less than the reference voltage $V_{ref}$, output $V_{OUT}$ 120 of IPC may track the value of the input signal voltage $V_{IN}$. In one set of embodiments, IPC 100 may be configured to operate at an operating voltage range of between 0V to 5V for $V_{IN}$, and an operating voltage range of between 3.0V and 3.6V for the reference voltage $V_{ref}$. The operating voltage range of $V_{clamp}$ may also be set to the same range as the operating range of $V_{ref}$.

Figure 3:
FIG. 3 is a truth table summarizing the operation of one embodiment of the input protection circuit of FIG. 1.

As mentioned above, IPC 100 may include a comparator 102 configured to compare the voltage level $V_{IN}$ with the reference voltage $V_{ref}$, where $V_{IN}$ may correspond to an input signal at an input pin of the IC. The supply voltage $V_{DD}$ may be internal to the IC or it may be provided externally to the IC. In general, $V_{DD}$ in this case refers to the supply voltage provided to the system or IC, with $V_{DD}$ having a specified operating range that comprises a maximum value not to be exceeded within the system or IC. The operation of IPC 100, according to one embodiment, is summarized in truth table 300 shown in FIG. 3. When $V_{IN} < V_{ref}$, output $C_{OUT}$ of comparator 102 may be deasserted (e.g. set to 0), which in turn may deassert (e.g. set to 0) output $L_{OUT}$ of level shifter 104. When $L_{OUT}$ of level shifter 104 is deasserted, output $V_{OUT}$ of multiplexer 120 (in this embodiment an analog multiplexer) may track (or follow) the value of $V_{IN}$. In other words, when $V_{IN} < V_{ref}$, $V_{OUT}$ 120 may have the same value as $V_{IN}$. When $V_{IN} \geq V_{DD}$, output $C_{OUT}$ of comparator 102 may be asserted (e.g. set to 1), which in turn may result in $L_{OUT}$ of level shifter 104 tracking input voltage $V_{IN}$. When $L_{OUT}$ is tracking (or following) $V_{IN}$, $V_{OUT}$ of multiplexer 120 may be set to the value of the voltage, in this case $V_{DD}$, supplied to the drain of PMOS device 114. Those skilled in the art will appreciate that comparator 102 may be equally configured to deassert $C_{OUT}$ when $V_{IN}$ is equal to $V_{ref}$, without altering the essential operation of IPC 100. However, for the sake of simplicity, only the case when $C_{OUT}$ is asserted when $V_{IN}$ is equal to $V_{ref}$ is explicitly disclosed herein.

As configured in IPC 100, level shifter circuit 104 may be used to change the assertion level of the multiplexer control signal. That is, $L_{OUT}$ may be used as one part of a select signal for multiplexer circuit 120. The circuit topology of level shifter 104 may be configured such that a left branch of level shifter circuit 104 is powered by the power supply voltage $V_{DD}$, while a right branch of level shifter circuit 104 is powered by a slightly attenuated version of the input voltage $V_{IN}$, which may be obtained at one terminal of resistor 108 with $V_{IN}$ coupled to the other terminal of resistor 108. One embodiment of level shifter circuit 104 will be described in further detail below with reference to FIG. 2b. In one embodiment, the value of resistor 108 is 150Ω. As previously mentioned, level shifter circuit 104 may be configured to follow the same logic as comparator 102 (see table 300 in FIG. 3). Level shifter 104 may thus be used to fully prevent the input voltage $V_{IN}$ from reaching the output $V_{OUT}$ of multiplexer 120 when $V_{IN} \geq V_{DD}$ (or when $V_{IN} > V_{DD}$).

Figure 2A:
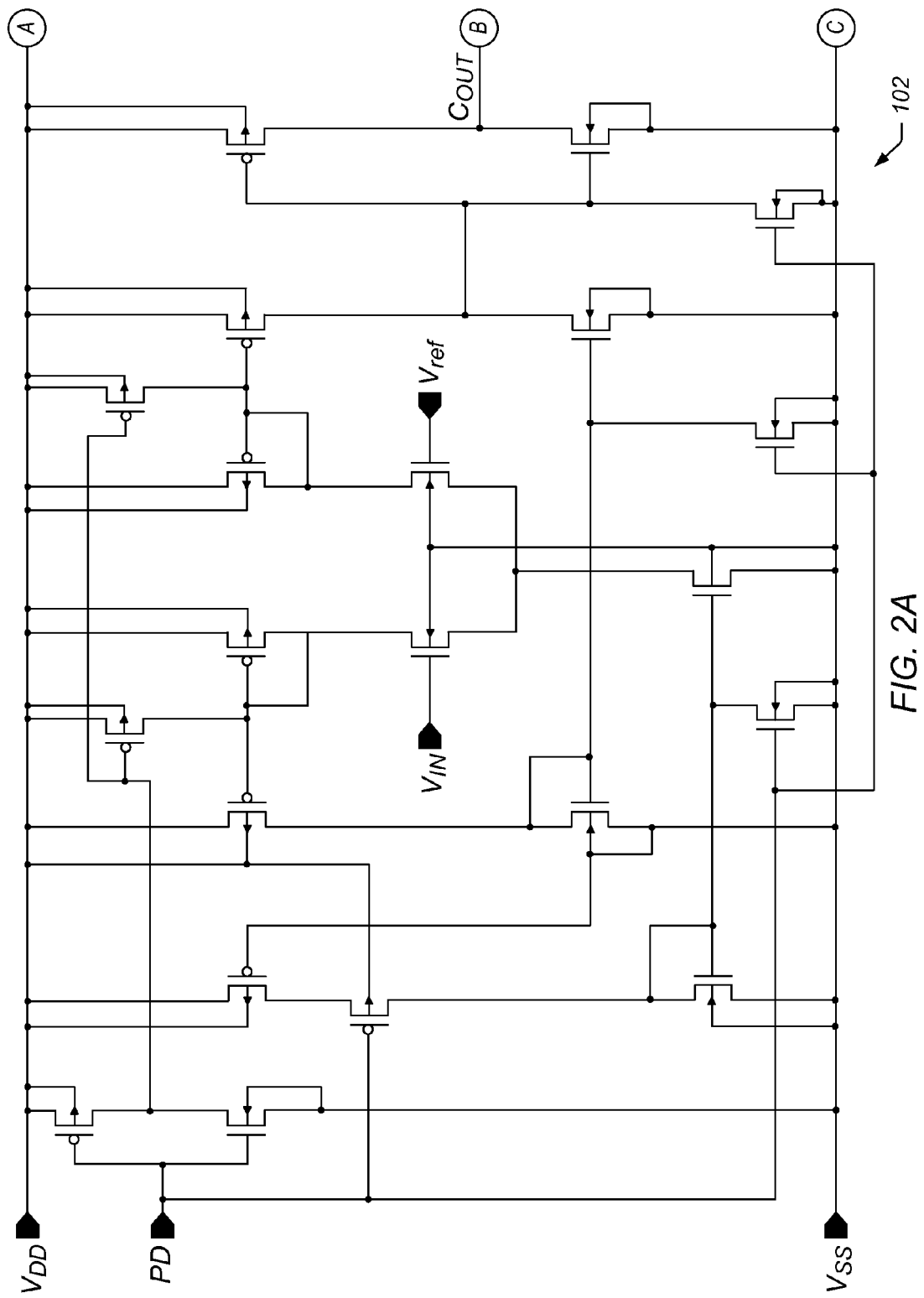
FIG. 2a shows a transistor diagram of one embodiment of the voltage comparator portion of the input protection circuit of FIG. 1.
Figure 2B:
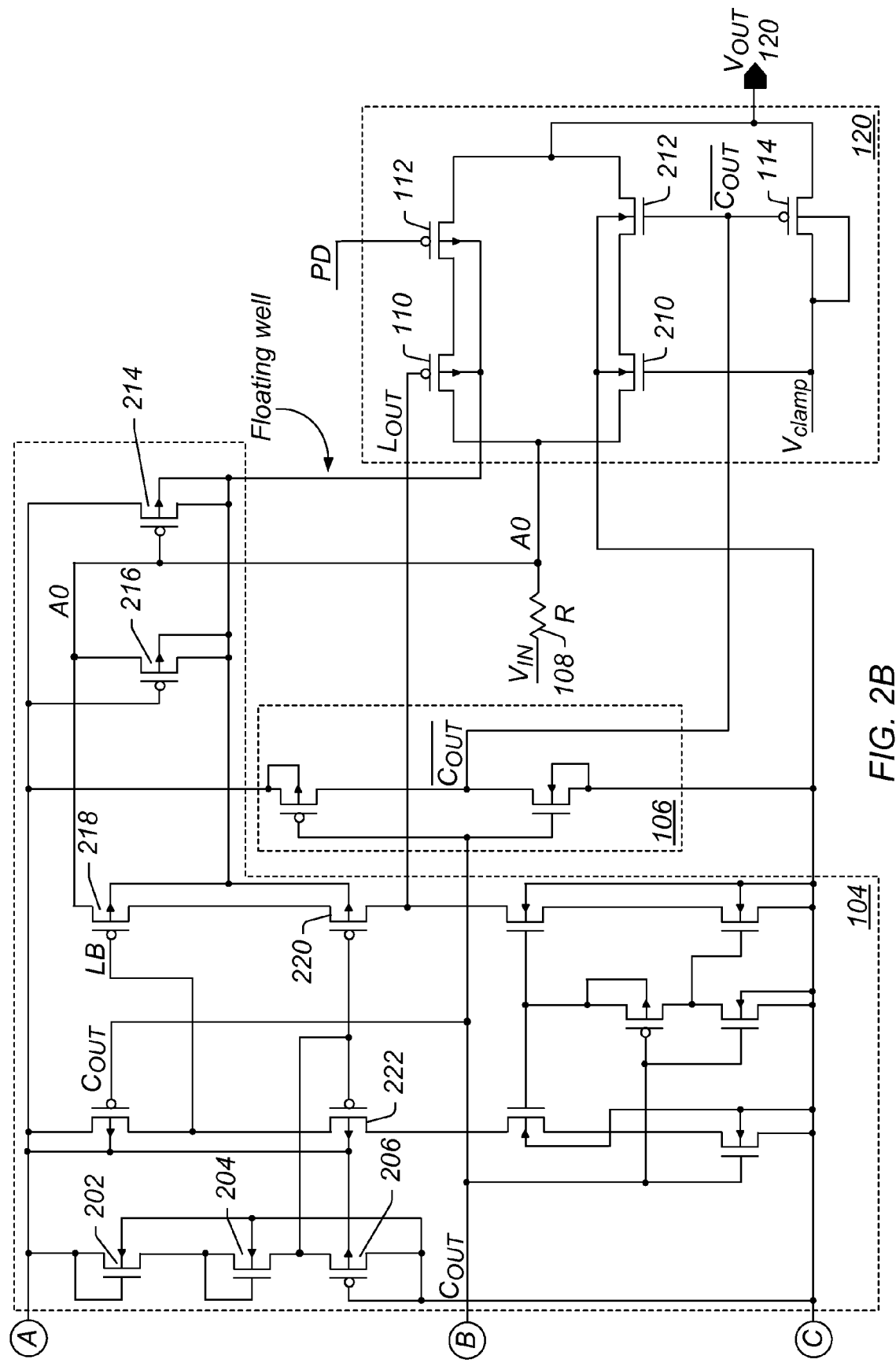
FIG. 2b shows a transistor diagram of one embodiment of the level shifter/inverter/multiplexer portion of the input protection circuit of FIG. 1.

FIGS. 2a and 2b show one embodiment of IPC circuit 100 configured with NMOS and PMOS devices. FIG. 2a shows one embodiment of comparator 102. As shown in FIG. 2b, analog multiplexer 120, controlled by comparator 102 and level shifter 104, may comprise PMOS devices 110 and 112 configured with a floating well to keep the well of the PMOS devices at the highest available voltage (either $V_{DD}$ or $V_{IN}$, depending on which voltage is higher). In the embodiment shown in FIG. 2b, the respective wells of PMOS devices 110, 112 (configured in multiplexer 120) and 214, 216, 218, and 220 may all be coupled together and left floating, to ensure the wells of these PMOS devices in both level shifter 104 and multiplexer 120 will be at the highest available voltage during operation of IPC 100. Resistor 108 (150Ω in some embodiments) may be coupled in series with the input voltage $V_{IN}$ to provide protection against latch-up. Level shifter circuit 104 may also include a diode bias circuit to provide protection against high voltage. In one set of embodiments, the diode bias circuit may be implemented with three transistor devices. Two diode-connected NMOS devices 202 and 204 may have their respective channels serially coupled together, with the drain of NMOS device 202 coupled to $V_{DD}$ (which may be a 3.3V power supply). One diode-connected PMOS device 206 may have its source coupled in series with the source of NMOS device 204, and its drain coupled to reference ground ($V_{SS}$). As a result of the body effect, the total threshold voltage of the three diode-connected transistor devices (202, 204, and 206) may be greater than the power supply $V_{DD}$, resulting in the bias circuit not conducting a DC current, thereby protecting the transistor devices from high voltage.

In some embodiments, a power-down signal (PD) may be provided to comparator 102, and multiplexer 120 (see FIGS. 1, 2a, and 2b). The PD signal may be used to power down IPC 100. As summarized in table 300 of FIG. 3, when the PD signal is asserted (e.g. set to 1), regardless of what the value of input signal voltage $V_{IN}$ is, the output $C_{OUT}$ of comparator 102 may be asserted, resulting in the output $L_{OUT}$ of level shifter 104 following (tracking) input voltage $V_{IN}$, and the output $V_{OUT}$ of multiplexer 120 being set to the value of the voltage $V_{clamp}$ provided at the drain of PMOS device 114. The PD signal may be deasserted during normal operation of IPC 100. In one set of embodiments, in order to pass the full range of the input signal voltage $V_{IN}$ to the output $V_{OUT}$, multiplexer 120 may be configured with full transmission gates instead of only PMOS devices 110 and 112 (shown in the logic diagram of FIG. 1). As shown in FIG. 2b, a first transmission gate comprising PMOS device 110 and NMOS device 210 may be coupled to a second transmission gate comprising PMOS device 112 and NMOS device 212. The presence of the PMOS devices (110 and 112) ensures that the full high voltage is present at $V_{OUT}$ when $V_{OUT}$ is meant to reside at a high voltage (e.g. $V_{clamp}$ or $V_{DD}$), while the presence of the NMOS devices (210 and 212) ensures that zero volts (0V) is present at $V_{OUT}$ when $V_{OUT}$ is meant to reside at 0V.

Thus, various embodiments of IPC 100 satisfy the requirement of relaying an input signal voltage $V_{IN}$, which may be received at an input pin of an IC that includes IPC 100, to its intended destination on the IC, while limiting the voltage level of the signal that reaches the intended destination on the IC to a specified allowed voltage ($V_{clamp}$), which, in certain embodiments, may be the value of the supply voltage used to power the IC. When $V_{IN}$ is less than or equal to $V_{ref}$ which may also be set to the power supply voltage $V_{DD}$, $V_{IN}$ may be relayed (in other words, allowed to propagate through) to its intended destination on the IC (or system). When $V_{IN}$ at the input pin is greater than $V_{ref}$ the value of the signal allowed to propagate into the system is held at the level of $V_{clamp}$. Various embodiments of IPC 100 may also provide protection against latch-up. It should also be noted, that the maximum level $V_{clamp}$ to which $V_{OUT}$ is limited does not need to be the same as the voltage to which $V_{IN}$ is compared, nor does it need to be the same as $V_{DD}$. In other words, various embodiments may have different values for $V_{ref}$, $V_{DD}$, and $V_{clamp}$, as determined by system requirements and/or various design considerations.

Although the embodiments above have been described in considerable detail, other versions are possible. For example, those skilled in the art will appreciate that while the disclosed embodiments feature certain NMOS/PMOS structures, alternative embodiments are possible in which the NMOS and PMOS devices are interchanged and the circuit structure is correspondingly modified to obtain the same overall functionality that characterizes the embodiments disclosed herein. Similarly, those skilled in the art will also appreciate that certain ones of the transistors in the circuits shown in FIGS. 1, 2a, and 2b may be replaced with bipolar devices to obtain the same overall functionality, behavior, and desired benefits that characterize the embodiments disclosed herein. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

We claim:

1. An input protection circuit comprising:
a first circuit configured to compare an input signal to a reference signal, and generate a first control signal indicative of whether the value of the input signal is greater than or equal to the value of the reference signal, or less than the value of the reference signal;
a second circuit configured to receive the first control signal, and generate a second control signal according to the first control signal, wherein the second control signal is set to a first specified value for a first value of the first control signal, and wherein a value of the second control signal tracks the value of the input signal for a second value of the first control signal; and
a third circuit configured to generate an output signal according to the first control signal and the second control signal, wherein a value of the output signal tracks the value of the input signal for the first value of the first control signal and the first specified value of the second control signal, and wherein the value of the output signal is set to a second specified value less than the value of the input signal for the second value of the first control signal.

2. The input protection circuit of claim 1, wherein the first value of the first control signal is indicative of the value of the input signal being less than the value of the reference signal, and wherein the second value of the first control signal is indicative of the input signal being greater than or equal to the value of the reference signal.

3. The input protection circuit of claim 1, wherein the second circuit is a level shifter circuit, having a first branch powered by a first supply voltage and a second branch powered by an attenuated version of the input signal.

4. The input protection circuit of claim 1, wherein the third circuit is a multiplexer configured to:
receive the input signal as a first input;
receive a second signal having the second specified value as a second input; and
switch between the first input and the second input to be the output signal, according to the value of the first control signal and the value of the second control signal.

5. The input protection circuit of claim 1, wherein the second specified value, and the value of the reference signal are each equal to the value of a power supply voltage used to power the input protection circuit.

6. A protection circuit comprising:
a first component configured to:
receive an input voltage and a reference voltage;
assert a first control signal when the input voltage is greater than or equal to the reference voltage; and
deassert the first control signal when the input voltage is less than the reference voltage;
a second component configured to:
deassert a second control signal when the first control signal is deasserted;
set the second control signal to track the input voltage when the first control signal is asserted; and
a third component configured to:
set an output voltage to a specified voltage less than the input voltage when the first control signal is asserted; and
set the output voltage to track the input voltage when the first control signal and the second control signal are both deasserted.

7. The protection circuit of claim 6, wherein the first component, second component, and third component comprise CMOS devices, wherein the first component, and at least a portion of the second component are powered by a specified supply voltage.

8. The protection circuit of claim 7, wherein the second component is a level shifter comprising a first branch powered by the specified supply voltage, and a second branch powered by a second supply voltage based on the input voltage; wherein the second branch of the level shifter comprises PMOS devices having a floating well to keep the respective well of each of the PMOS devices at a highest possible voltage level.

9. The protection circuit of claim 8, wherein the level shifter further comprises a bias circuit coupled between the specified supply voltage and reference ground to set a control voltage level at a control terminal of a transistor device in an output stage of the level shifter.

10. The protection circuit of claim 8, further comprising a resistor coupled between the input voltage and the level shifter to provide protection against latch-up.

11. The protection circuit of claim 9, wherein a total threshold voltage for the bias circuit is greater than the specified supply voltage.

12. The protection circuit of claim 9, wherein the bias circuit comprises diode-connected transistors having their channels coupled in series.

13. The protection circuit of claim 6, wherein the third component is an analog multiplexer comprising:
 a pair of transmission gates coupled in series, controlled by the second control signal and the first control signal, and having one end coupled to the input voltage and the other end coupled to an output node configured to provide the output voltage; and
 a transistor having a control terminal controlled by the first control signal, and having a first channel terminal configured to receive the specified voltage and the other channel terminal coupled to the output node;
 wherein the pair of transmission gates are configured to relay the input voltage to the output node when the first control signal and the second control signal are both deasserted; and
 wherein the transistor device is configured to relay the specified voltage to the output node when the first control signal is asserted.

14. A method for protecting a system from high voltage, the method comprising:
 comparing an input voltage to a reference voltage;
 generating a first control signal in response to said comparing, wherein the first control signal is indicative of whether the input voltage is greater than or equal to the reference voltage, or less than the reference voltage;
 setting a second control signal:
  to a first specified voltage in response to the first control signal indicating that the input voltage is less than the reference voltage; and
  to the input voltage in response to the first control signal indicating that the input voltage is greater than or equal to the reference voltage; and
 setting an output:
  to a second specified voltage less than the input voltage in response to the first control signal indicating that the input voltage is greater than or equal to the reference voltage; and
  to the input voltage in response to:
   the first control signal indicating that the input voltage is less than the reference voltage; and
   said setting the second control signal to the first specified voltage.

15. The method of claim 14, wherein the reference voltage and the second specified voltage are equal to a supply voltage configured to provide power to the system.

16. The method of claim 14, wherein said generating the first control signal comprises asserting the first control signal when the input voltage is greater than or equal to the reference voltage, and deasserting the first control signal when the input voltage is less than the reference voltage.

17. The method of claim 14, wherein said setting the output to the input voltage comprises:
 controlling a pair of transmission gates with the first control signal and the second control signal; and
 the transmission gates relaying the input voltage from an input of the transmission gates to the output.

18. The method of claim 14, wherein said setting the output to the second specified voltage comprises controlling a transistor device with the first control signal to relay the second specified voltage from one of its channel terminals to the output.

19. An integrated circuit comprising:
 a function block;
 at least one input pin configured to receive an input signal intended for at least one specific destination within the function block, the input signal having a voltage value; and
 a protection circuit coupled between the at least one input pin and the function block, wherein the protection circuit is configured to:
  allow the input signal to propagate to the at least one specific destination within the function block when the voltage value of the input signal does not exceed the value of a specified reference voltage; and
  provide a replacement signal to propagate to the at least one specific destination within the function block instead of the input signal when the voltage value of the input signal exceeds the value of the specified reference voltage, wherein the voltage value of the replacement signal is no greater than the value of a supply voltage configured to power the integrated circuit, and wherein the voltage value of the replacement signal corresponds to the logic level represented by the voltage value of the input signal.

20. The integrated circuit of claim 19, wherein the voltage value of the replacement signal is the same as the value of the supply voltage.

21. The integrated circuit of claim 20, wherein the value of the specified reference voltage is the same as the value of the supply voltage.

22. A method for protecting a system against high voltage, the method comprising:
 receiving an input signal intended for at least one specific destination within the system, the input signal having a voltage value;
 intercepting the input signal before it reaches the at least one specific destination within the system;
 allowing the input signal to propagate to the at least one specific destination within the system when the voltage value of the input signal does not exceed the value of a specified reference voltage; and
 generating a replacement signal to replace the input signal when the voltage value of the input signal exceeds the value of the specified reference voltage, wherein the voltage value of the replacement signal is no greater than the value of a supply voltage configured to provide power to the system, and wherein the voltage value of the replacement signal corresponds to the logic level represented by the voltage value of the input signal.

23. The method of claim 22, further comprising propagating the replacement signal to the at least one specific destination within the system.

24. The method of claim 22, wherein the system is an integrated circuit, wherein said receiving the input signal is at a pin of the integrated circuit.

25. The method of claim 24, wherein the integrated circuit is fabricated using a fabrication process yielding CMOS devices.

* * * * *